(12) United States Patent
Hurwitz

(10) Patent No.: US 10,601,397 B2
(45) Date of Patent: Mar. 24, 2020

(54) RF RESONATOR ELECTRODE AND MEMBRANE COMBINATIONS AND METHOD OF FABRICATION

(71) Applicant: Crystal Waves LABs Limited, Hong Kong (HK)

(72) Inventor: Dror Hurwitz, Zhuhai (CN)

(73) Assignee: Zhuhai Crystal Resonance Technologies Co., Ltd., Zhuhai (CN)

( * ) Notice: Subject to any disclaimer, the term of this patent is extended or adjusted under 35 U.S.C. 154(b) by 277 days.

(21) Appl. No.: 15/468,729

(22) Filed: Mar. 24, 2017

(65) Prior Publication Data

US 2018/0278233 A1 Sep. 27, 2018

(51) Int. Cl.
*H01L 41/187* (2006.01)
*H03H 9/17* (2006.01)
*H03H 9/02* (2006.01)
*H03H 3/02* (2006.01)

(52) U.S. Cl.
CPC ............ *H03H 9/176* (2013.01); *H03H 3/02* (2013.01); *H03H 9/02031* (2013.01); *H03H 9/171* (2013.01)

(58) Field of Classification Search
CPC ...... H03H 9/276; H03H 3/02; H03H 9/02031; H03H 9/171
USPC .......................................... 310/359, 363–365
See application file for complete search history.

(56) References Cited

U.S. PATENT DOCUMENTS

| 5,739,563 | A | 4/1998 | Kawakubo et al. |
| 5,853,500 | A * | 12/1998 | Joshi ............... C23C 18/1216 148/247 |
| 6,212,057 | B1 | 4/2001 | Kohara et al. |
| 6,319,764 | B1 * | 11/2001 | Basceri ............ C23C 16/409 438/240 |
| 6,503,573 | B1 | 1/2003 | Horwitz et al. |
| 6,624,462 | B1 | 9/2003 | Kohara et al. |
| 2018/0090663 | A1 * | 3/2018 | Arakawa ............ H01L 41/042 |
| 2018/0090668 | A1 * | 3/2018 | Miyazawa ........... H01L 41/09 |
| 2018/0226561 | A1 * | 8/2018 | Iwazaki ............. H01L 41/053 |

FOREIGN PATENT DOCUMENTS

| JP | 2009-280441 | 12/2009 | |
| JP | 201003758 A * | 1/2010 | ............... H01G 4/33 |

OTHER PUBLICATIONS

Losego et al., "Epitaxial Ba0.5Sr0.5TiO3-GaN heterostructures with abrupt interfaces", Journal of Crystal Growth, vol. 211, 2009, pp. 1106-1109 (Year: 2009) (4 pages).
Machine English Language Translation of JP 2009-280441 provided by ESPACE Website, Internet retrieval date of Mar. 25, 2019 (Year: 2009) (19 pages).

* cited by examiner

*Primary Examiner* — Thomas M Dougherty
(74) *Attorney, Agent, or Firm* — Wiggin and Dana LLP; Gregory S. Rosenblatt; Rikesh P. Patel

(57) ABSTRACT

A piezoelectric resonator membrane having a thickness in the range of 200 nm to 500 nm wherein the thickness may be controlled to within 1%; the membrane being sandwiched between electrodes to create a resonator, wherein at least one of the electrodes comprises aluminum thereby minimizing damping due to the weight of the electrode.

9 Claims, 5 Drawing Sheets

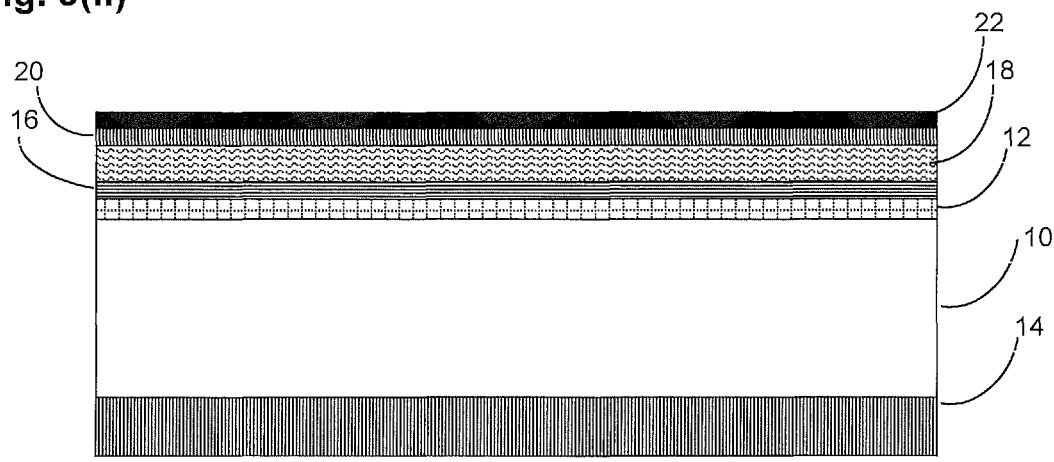
Fig. 3(iii)

RF RESONATOR ELECTRODE AND MEMBRANE COMBINATIONS AND METHOD OF FABRICATION

BACKGROUND

Mobile phone users require quality reception and transmission over a wide area. The quality of the radio frequency (RF) signal depends on the RF filters in the mobile phone. Each RF filter passes desired frequencies and rejects unwanted frequencies enabling band selection and allowing a mobile phone to process only the intended signal.

It has been estimated that by 2020, a shift to Carrier aggregation, 5G and 4×4 MIMO could result in mobile phones requiring upwards of 100 filters and a global market of 200 billion filters a year.

Acoustic resonators are a basic building block of RF filters and sensors. These typically include a piezoelectric electromechanical transduction layer which converts mechanical energy into electrical energy. These resonators have to be cheap but reliable. The two most common types of acoustic resonators are Surface Acoustic Wave Resonators (SAW) and Bulk Acoustic Wave Resonators (BAW).

In Surface Acoustic Wave resonators the acoustic signal is carried by a surface wave. In Bulk Acoustic Wave Resonators (BAW) the signal is carried through the bulk of the resonator film. The resonant frequency of both types of filter is a characteristic of its dimensions and of the mechanical properties of the materials used in their construction.

The quality of a resonator is given by its Q factor. This is the ratio of the energy stored to the power dissipated. A high Q factor indicates that the filter loses little energy during operation. This translates to a lower insertion loss and a steeper skirt for "sharper" differentiation to nearby bands.

The next generation of mobile phones will be required to operate at higher frequencies to enable transmitting and receiving the ever growing data traffic. Moving to such higher frequencies without enlarging the mobile phone requires small low power resonators that operate at higher frequencies and that can be used in smart phones without rapid depletion of the battery power pack.

The quality factor or Q factor is a dimensionless parameter that describes how under-damped an oscillator or resonator is, and characterizes a resonator's bandwidth relative to its center frequency. The next generation of mobile phones requires quality resonators having high Q factors.

Bulk-acoustic-wave (BAW) filters provide better performance than surface acoustic wave filters. Whereas the best SAW filters may have Q factors of 1000 to 1500, current state of the art BAW resonators have Q factors of 2500 to 5000.

BAW filters can operate at higher frequencies than SAW filters. They have better power handling, a smaller size, higher electrostatic discharge (ESD), better bulk radiation and less out of band ripple.

However, SAW filters are simpler and cheaper to manufacture and since the IDT pitch can be varied by the mask layout, resonators having significantly different frequencies can be made on the same die, using the same piezoelectric film thickness.

The electrical impedance of a BAW resonator has two characteristic frequencies: the resonance frequency $f_R$ and anti-resonance frequency $f_A$. At $f_R$, the electrical impedance is very small whereas at $f_A$, the electrical impedance is very large. Filters are made by combining several resonators. The shunt resonator is shifted in frequency with respect to the series resonator. When the resonance frequency of the series resonator equals the anti-resonance frequency of the shunt resonator, the maximum signal is transmitted from the input to the output of the device. At the anti-resonance frequency of the series resonator, the impedance between the input and output terminals is high and the filter transmission is blocked. At the resonance frequency of the shunt resonator, any current flowing into the filter section is shorted to ground by the low impedance of the shunt resonator so that the BAW filter also blocks signal transmission at this frequency. The frequency spacing between $f_R$ and $f_A$ determines the filter bandwidth.

For frequencies other than the resonance and anti-resonance frequencies, the BAW resonator behaves like a Metal-Insulator-Metal (MIM) capacitor. Consequently, far below and far above these resonances, the magnitude of the electrical impedance is proportional to 1/f where f is the frequency. The frequency separation between $f_R$ and $f_A$ is a measure of the strength of the piezoelectric effect in the resonator that is known as the effective coupling coefficient—represented by $K^2_{eff}$. Another way to describe the effective coupling coefficient is as a measure of the efficiency of the conversion between electrical and mechanical energy by the resonator (or filter). It will be noted that the electromechanical coupling coefficient is a materials related property that defines the $K^2_{eff}$ for the piezoelectric film.

The level of performance of a filter is defined by its factor of merit (FOM) which is defined as $FOM=Q*K^2_{eff}$.

For practical applications, both a sufficiently high $K^2_{eff}$ and high Q factor values are desired. However, there is a trade-off between these parameters. Although $K^2_{eff}$ is not a function of frequency, the Q-value is frequency dependent and therefore the FOM (Factor of Merit) is also a function of frequency. Hence the FOM is more commonly used in filter design than in the resonator design.

Depending on the application, often device designers can tolerate a lowering in the $K^2_{eff}$ to achieve a high Q factor where a small sacrifice in $K^2_{eff}$ gives a large boost in the Q value. However, the opposite approach of sacrificing Q-value to obtain a design having an adequate $K^2_{eff}$ is not feasible.

$K^2_{eff}$ can be enhanced by choosing a high acoustic impedance electrode, and can also be traded off with other parameters such as electrode thickness and a thicker passivation layer.

There are two main types of BAW resonators (and thus filters): SMR (solidly mounted resonators) and FBAR (Film Bulk Acoustic Resonator resonators.

In the SMR resonator, a Bragg reflector is created under the bottom electrode using a stack of alternating low and high impedance thin film layers, each having a thickness $\lambda/4$, where $\lambda$ is the wavelength of the target frequency. The Bragg reflector stack acts an acoustic mirror to reflect the acoustic wave back into the resonator.

SMR resonators are easier (and thus typically cheaper) to manufacture than FBAR resonators and since the piezoelectric film is attached directly to the substrate, heat is dissipated more effectively. However, in SMR based filters, only the longitudinal acoustic wave is reflected, but not the shear waves. Consequently SMR filter designs have lower Q factors than FBAR based filters.

In the FBAR resonator a free-standing bulk acoustic membrane which is supported only around its edge is used. An air cavity is provided between the bottom electrode and the carrier wafer. The high Q factor of the FBAR is a great advantage over the SMR.

The Commercial FBAR filter market is dominated by Broadcom™ (previously AVAGO™) which uses Aluminum Nitride (AlN) as the piezoelectric thin-film material that best balances performance, manufacturability and Wafer Level Packaging (WLP) processing that employs silicon cavity micro-capping over the FBAR device with TSV (through silicon via) for flip chip electrical contacts. AlN has the highest acoustic velocity for a piezoelectric film (11,300 m/s) and hence requires a thicker film for a given resonance frequency which eases process tolerances. Furthermore, high quality sputtered AlN films with FWHM (Full width at half maximum XRD peak) of less than 1.8 degrees allow $K^2_{eff}$ values that are above 6.4% which is conveniently about twice the transmit band for FCC mandated PCS. With Q values reaching 5000, FOM values of 250 to 300 are achievable, representing best in class filter devices. $K^2_{eff}$ must be kept constant to meet the band requirement. Consequently, to improve the FOM of a filter generally requires increasing the Q value.

Despite the high performance of the above mentioned FBAR filters, issues still remain that prevent moving forward to the next generation of wireless communication. The greater number of users sending and receiving more data results in increasingly jammed bands. To overcome this, future bandwidths should be more flexible to adapt to agile arrangements of different bands. For example, The 5 GHz WiFi band has 3 sub-bands located at 5.150-5.350 GHz, 5.475-5.725 GHz, 5.725-5.825 GHz, respectively, corresponding to required $K^2_{eff}$ of around 7.6%, 8.8% and 3.4%. The coupling coefficient $K^2_{eff}$ is mainly decided by the intrinsic nature of the piezoelectric material, but is affected by the crystalline quality and orientation of the piezoelectric film, by exterior capacitors and inductors and by the thickness of the electrodes and other stacked materials. The bandwidth of AlN FBARs is mainly modulated by inductors and capacitors that are pre-integrated into the IC substrate carrier. However, these elements degrade the Q factor and also increase the substrate layer count and thus the size of the final product. Another approach for $K^2_{eff}$ modulation is to use an electrostrictive material to realize tunable band FBAR filters. One candidate material is $Ba_xSr_{1-x}TiO_3$ (BST) that may be tuned once the DC electrical field is applied Tunability with BST can also be achieved by using it as a variable capacitor build in part with the FBAR resonators circuitry thereby assisting in matching filters and in adjusting their rejection. Furthermore, since a BST FBAR resonates only with a certain applied DC bias voltage, it may represent low leakage switching properties, potentially eliminating switches from the Front End Module (FEM) of the mobile device and thereby simplifying module architecture and reduce both size and cost. BST FBARs also possess other favorable properties for RF applications. The high permittivity of ferroelectric materials ($\epsilon r>100$) allows for reduction in the size of devices; for example, a typical BST resonator area and BST filter area is in the order of 0.001 mm$^2$ and 0.01 mm$^2$, respectively, at low GHz frequencies in standard 50-Ω RF systems. In fact, using BST the resonator size may be an order of magnitude smaller than that of conventional AlN resonators. Moreover, the power consumption in the BST FBAR itself is negligible even with the usage of the above-mentioned DC bias voltage across the device due to a very small leakage current in the BST thin-film.

Unfortunately, AlN, $Ba_xSr_{(1-x)}TiO_3$ (BST) and other piezoelectric materials have vast lattice spacing and orientation differences to those of currently used bottom electrode metals making it impossible to deposit strongly textured or single crystal films of these materials onto the bottom electrode materials. Furthermore, the range of bottom electrode materials available, especially in the case of BST, is very limited since they have to withstand relatively high temperatures during the subsequent deposition of the piezoelectric film thereupon.

The use of refractory materials for electrodes is not ideal as they tend to have high resistances and are dense, which dampens resonators with such electrodes.

SUMMARY

A first aspect is directed to a resonator comprising a piezoelectric membrane sandwiched between upper and lower electrodes, wherein the lower electrode comprises aluminum.

Preferably the piezoelectric membrane comprises a single crystal.

Preferably the piezoelectric membrane comprises $Ba_xSr_{(1-x)}TiO_3$.

Preferably the piezoelectric membrane comprises $Ba_xSr_{(1-x)}TiO_3$ single crystal.

Typically the piezoelectric membrane has an <111> orientation.

Typically x is between 0.2 and 0.5 and is controlled to within a tolerance of ±1%.

Typically, the resonator further comprises an adhesion layer between the lower electrode and the piezoelectric membrane.

Typically the adhesion layer comprises titanium.

Typically the adhesion layer has a thickness in the range of 5 nm to 50 nm.

Typically the lower electrode is 100 nm±5 nm thick.

Preferably both upper and lower electrodes comprise aluminum.

A second aspect is directed to a method of fabricating a piezoelectric membrane with an aluminum lower electrode comprising growing the piezoelectric membrane with oxide molecular beam epitaxy onto a substrate followed by physical vapor deposition of the aluminum on to the piezoelectric crystal.

Preferably the piezoelectric membrane is a single crystal.

Preferably the piezoelectric membrane comprises $Ba_xSr_{(1-x)}TiO_3$ single crystal.

Typically an adhesion layer of titanium is deposited onto the piezoelectric layer prior to sputtering the lower electrode.

Typically the adhesion layer is deposited by sputtering.

Optionally the substrate is a c-axis <0001> single crystal sapphire membrane covered with a c-axis <0001> single crystal GaN release layer.

Preferably a buffer layer of $TiO_2$ or $SrTiO_3$ or a double buffer layer comprising a layer of $TiO_2$ followed by a layer of $SrTiO_3$ is deposited onto the single crystal GaN release layer prior to depositing the $Ba_xSr_{(1-x)}TiO_3$.

Preferably the barrier layer is deposited by oxide molecular beam epitaxy.

Preferably the $Ba_xSr_{(1-x)}TiO_3$ is deposited by oxide molecular beam epitaxy.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 3(ii) is a schematic representation of the single crystal on sapphire carrier of FIG. 3(ii), with the addition of an adhesion layer, and FIG. 3(iii) is a schematic representation of the structure shown in FIG. 1(d) with the addition of an aluminum electrode layer.

DESCRIPTION OF EMBODIMENTS

Strong c-axis texture is the most important prerequisite for AlN or BST based FBARs because the acoustic mode for such FBARs needs to be longitudinally activated, and the piezoelectric axis of both AlN and BST is along the c-axis.

Furthermore, there is an inverse thickness to operating frequency relationship for AlN and BST filter films. Ultra thin-films are needed for extremely high frequency filters such as 5 GHz WiFi, Ku and K band filters. For filter operating at 6.5 GHz the thickness of BST film should be around 270 nm and for 10 GHz the thickness of an AlN film should be around 200 nm. Attaining these dimensions is a serious challenge because it is hard to attain the necessary stiffness for an extremely thin anchored membrane and the crystalline defects and strains are more likely to cause cracks and mechanical failures as the film becomes thinner.

The present invention is directed to epitaxial piezo films and electrodes for making resonators and filters from such films. Strongly textured epitaxially grown piezoelectric films are expected to have smoother surfaces than those of randomly oriented films.

When used as resonator membranes in filters, a reduced scattering loss and a smoother interface between the metal electrodes and the piezoelectric films are attained which both contribute to a higher Q-factor. For this reason, defect-free single crystal films are needed for the next generation of high frequency FBARs.

High quality single crystal piezoelectric film, as represented by FWHM of less than 1°, have great impact on FBAR and SMR filter properties and can reduce the RF power that is otherwise wasted as heat by as much as 50%. This power saving can significantly reduce the rate of drop calls and increase the battery life of mobile phones.

Unfortunately, AlN, $Ba_xSr_{(1-x)}TiO_3$ (BST) and other piezoelectric materials have vast lattice spacing and orientation differences to those of currently used bottom electrode metals making it impossible to deposit such films onto the bottom electrode materials. Furthermore, the range of bottom electrode materials available, especially in the case of BST, is very limited since they have to withstand relatively high temperatures during the subsequent deposition of the piezoelectric film thereupon. As a result, to date, no true high quality single crystal piezoelectric films suitable for use in RF filters have been successfully demonstrated.

Aspects of the present invention are directed to such single crystal piezoelectric films and electrodes for use in RF filters.

Figure 1:
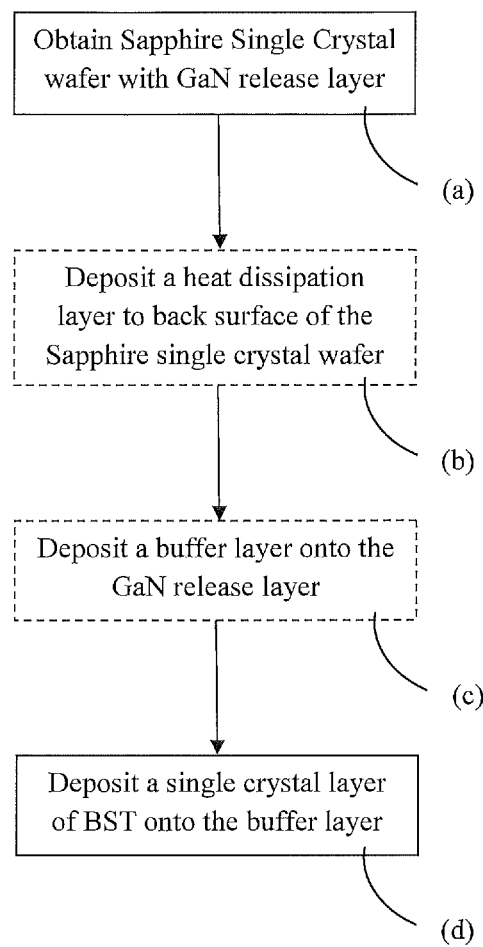
FIG. 1 is a flowchart showing how a single crystal piezoelectric resonator membrane may be fabricated.
Figure 1A:
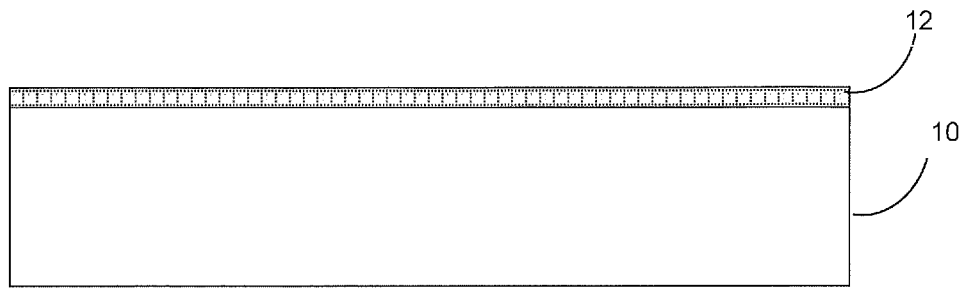
FIG. 1(a) is a schematic representation of a sapphire single crystal wafer with an epitaxially grown GaN coating.

With reference to FIG. 1(a) a C-axis <0001>±1° Sapphire wafer 10 with an un-doped Gallium Nitride (U-GaN) release layer C-axis <0001>±1° 12 is obtained. Such sapphire wafers 10 with U-GaN 12 deposited thereon are commercially available. Sapphire wafers with 2", 4" and 6" diameters are commercially available with thicknesses of 430 μm to 700 μm and a polished surface having an RMS smoothness of less than 1 nm. The U-GaN layer 12 has a thickness of 4 μm microns and a polished surface having an RMS of less than 1 nm ready for epitaxial growth thereon. At present such Sapphire wafers 10 coated with U-GaN 12 are commercially available from various Chinese manufacturers including San'an Optoelectronics Co., Ltd. (San'an™), Suzhou Nanowin Science and Technology Co., Ltd (NANOWIN™) and from Hexalux™. These substrates were developed for the Light Emitting Diode (LED) industry.

Figure 1B:
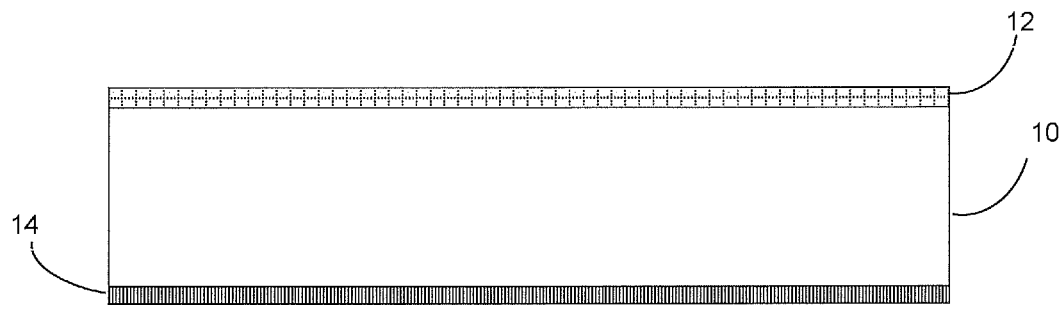
FIG. 1(b) is a schematic representation of the sapphire single crystal wafer with epitaxially grown GaN coating of FIG. 1(a) with a heat dissipating coating on its back side.

With reference to FIG. 1(b), to aid heat dissipation, a metal layer 14 is deposited on the back of the sapphire wafer 10, i.e. the side opposite to the side coated with GaN 12. The thickness of the metal layer 14 depends on the metal used. In this instance, and because of the nature of the buffer layer 16 and piezoelectric material 18 subsequently deposited (see below) titanium is a good candidate for the heat dissipating metal layer 14, and an appropriate thickness is about 150 nm thick. The heat dissipating metal layer 14 may be deposited by a physical vapor deposition, such as sputtering, for example.

Figure 1C:
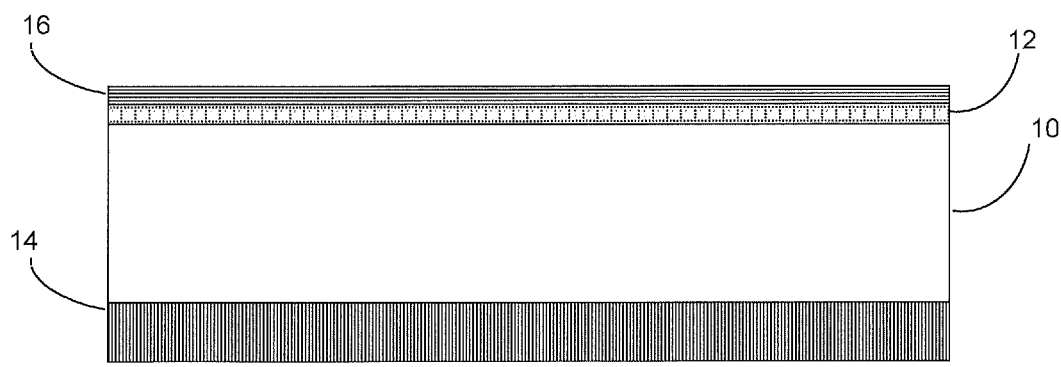
FIG. 1(c) is a schematic representation of the sapphire single crystal wafer with epitaxially grown GaN coating and heat dissipating coating on its back side of FIG. 1(b) further comprising a single crystal buffer layer comprising single crystal $TiO_2$ or single crystal $SrTiO_3$ or single crystal $TiO_2$ followed by single crystal $SrTiO_3$ deposited by oxide molecular beam epitaxy onto the GaN coating.

With reference to FIG. 1(c) a buffer layer 16 of <100> $TiO_2$ (rutile) or one of <111> $SrTiO_3$ or a single crystal of <100> $TiO_2$ layer followed by a <111> single crystal $SrTiO_3$ layer may be deposited onto the Gallium Nitride release layer C-axis <0001>±1° (U-GaN) 12 using Oxide Molecular Beam Epitaxy using commercially available equipment that is obtainable from vendors such as Vacuum Microengineering Inc., Varian™, Veeco™ and SVT Associates™. The Gallium Nitride release layer 12 is typically about 4 nm thick and has an RMS smoothness of <2 nm. Because of the lattice matching between the <100> plane of the rutile $TiO_2$ or the <111> plane of single crystal $SrTiO_3$ in the buffer layer 16 and the <0001> plane of the GaN 12 and Sapphire 10, the buffer layer 16 is laid down as a single crystal membrane.

Figure 1D:
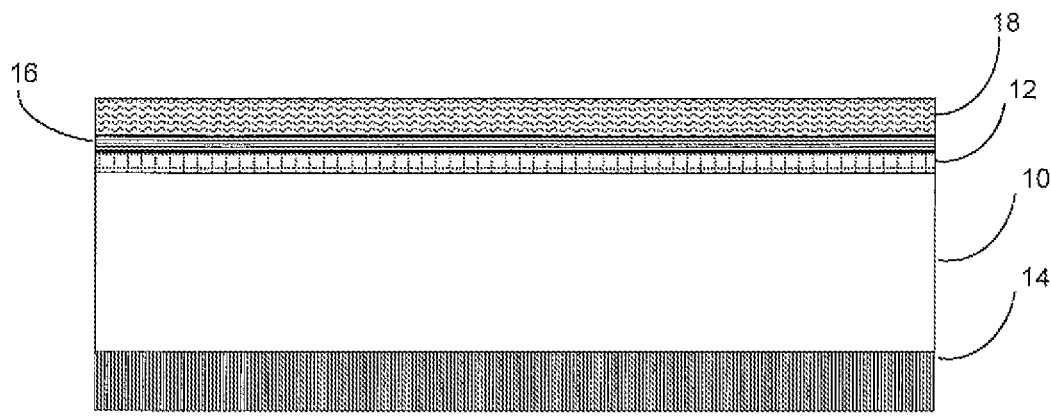
FIG. 1(d) is a schematic representation of the sapphire single crystal wafer with epitaxially grown GaN coating, a heat dissipating coating on its back side and a buffer layer deposited by oxide molecular beam epitaxy onto the GaN coating further comprising a single crystal layer of BST also deposited by oxide molecular beam epitaxy.

Referring now to FIG. 1(d) a layer of $Ba_xSr_{(1-x)}TiO_3$ (BST) 18 having a thickness of between 30 nm and 40 nm is then deposited onto the buffer layer 16 using oxide molecular beam epitaxy (MBE) using targets of Barium Oxide, Strontium Oxide and Titanium Oxide in low pressure excess oxygen. The oxide molecular beam epitaxy (MBE) is a high purity low energy deposition technique that allows for low point defect manufacturing. Because of the close matching between the <111> $Ba_xSr_{(1-x)}TiO_3$ 18 lattice spacing and the lattice spacing of the <100> $TiO_2$ (rutile)/111> single crystal $SrTiO_3$ buffer layer 16 and between the lattice spacing of the buffer layer 16 and the lattice spacing of the C-axis <0001>±1° Sapphire wafer 10 with C-axis <0001>±1° Gallium Nitride (U-GaN) 12 release layer, the $Ba_xSr_{(1-x)}TiO_3$ 18 is deposited as a single crystal membrane with a thickness in the range of 200 nm to 500 nm, but within tolerances of ±1%.

Figure 2:
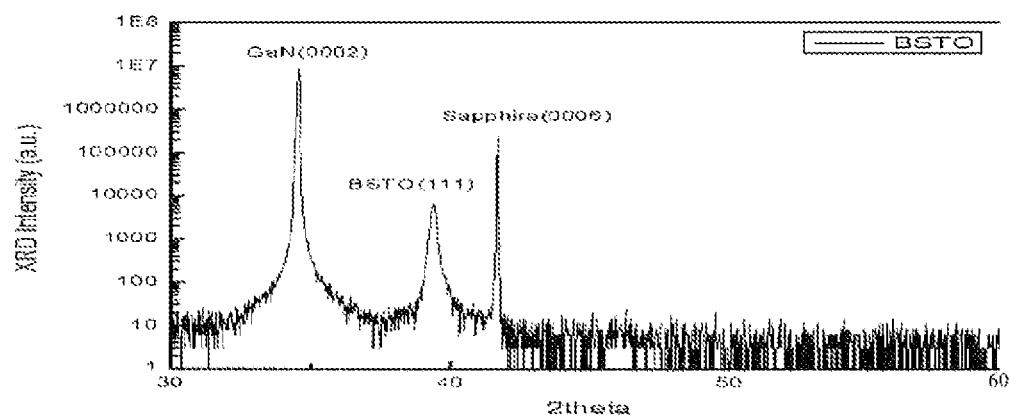
FIG. 2 is a 180° XRD spectrum of the structure of FIG. 1(d) showing that a single crystal membrane of BST was obtained.

With reference to FIG. 2 an XRD spectrum of the stack is shown, demonstrating that the $Ba_xSr_{(1-x)}TiO_3$ membrane is truly epitaxial <111> single crystal $Ba_xSr_{(1-x)}TiO_3$ having a full width half maximum of 1°.

It is apparently the first time that a single crystal membrane of <111> lattice spacing of $Ba_xSr_{(1-x)}TiO_3$ has been grown. It will be appreciated that grain boundaries inhibit the transmission of acoustic waves and in poly-crystal piezoelectric membranes, not only are there grain boundaries which lower the Q-factor, but it is also not easy to control the grain size and so these introduce repeatability and reproducibility issues. Unlike poly-crystal piezoelectric which attenuates the signal, it will be appreciated that using a single crystal membrane provides unprecedented Q values and quality control.

It is possible to control the Barium to Strontium ratio with high accuracy, and this affects the flexibility and resonance of the membrane.

For example, a <111> orientation single crystal membrane of $Ba_{0.5}Sr_{0/5}TiO_3$ with a tolerance of ±1% may has a Q value of 200.

A <111> orientation single crystal membrane of $Ba_{0.35}Sr_{0.65}TiO_3$ with a tolerance of ±1% and has a Q value of 2000.

A <111> orientation single crystal membrane of $Ba_{0.2}Sr_{0.8}TiO_3$ with a tolerance of ±1% and has a Q value of 4000.

The smoothness of epitaxially grown BST membranes may have an RMS of less than 1.5 nm. This effectively eliminates the so called ripple effect.

Bulk Acoustic Resonators (BAW) such as FBAR and SMR, comprise piezoelectric membranes sandwiched between metal electrodes. Typically a piezoelectric material is deposited onto the electrode. Consequently, the electrode material has to withstand the processing temperatures for fabricating the piezoelectric material requiring refractory metals such as tungsten, molybdenum and platinum to be used. Such refractory metals have dense and thus mechanically damp the resonator when used as electrodes. Refractory metals typically have high resistance which is also undesirable.

It is a feature of the technology disclosed herein that piezoelectric films are first fabricated and only then an electrode metal is applied onto the piezoelectric film. Consequently the electrode material does not have to withstand deposition or fabrication temperatures of the piezoelectric material and a wider range of materials may be used. For example, with reference to FIG. 3 and with further reference to FIG. 3(i) a piezoelectric crystal 18 on carrier substrate 10 is obtained—step 3(i). The carrier may be a single crystal sapphire wafer 10 with GaN release layer 12, having a heat dissipation layer of 14 applied to the back surface, and a buffer layer 16 of $TiO_2/SrTiO_3/TiO_2+SrTiO_3$ double layer epitaxially grown on the GaN release layer 12 followed by a piezoelectric crystal membrane 18 grown onto the buffer layer 16 as shown in FIG. 1(d). Thus with reference to the method of FIG. 1 mutatis mutandis, the piezoelectric crystal membrane 18 may be a single crystal of $Ba_xSr_{(1-x)}TiO_3$.

Figure 3:
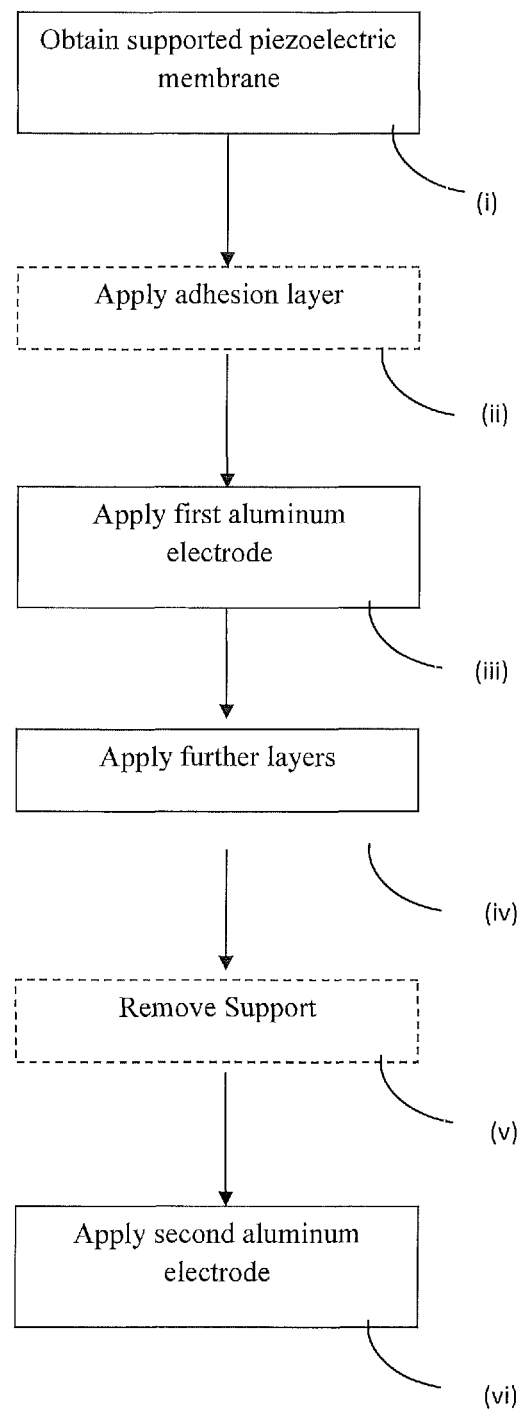
FIG. 3 is a flowchart showing how a first aluminum electrode may be deposited onto a piezoelectric membrane.
Figure 3I:
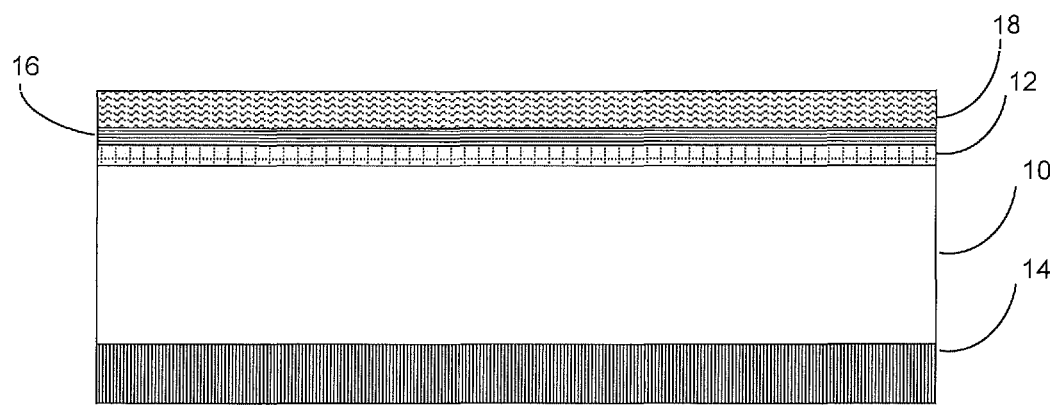
FIG. 3(i) is a schematic representation of the single crystal on substrate of FIG. 1(d) mutatis mutandis.
Figure 3:
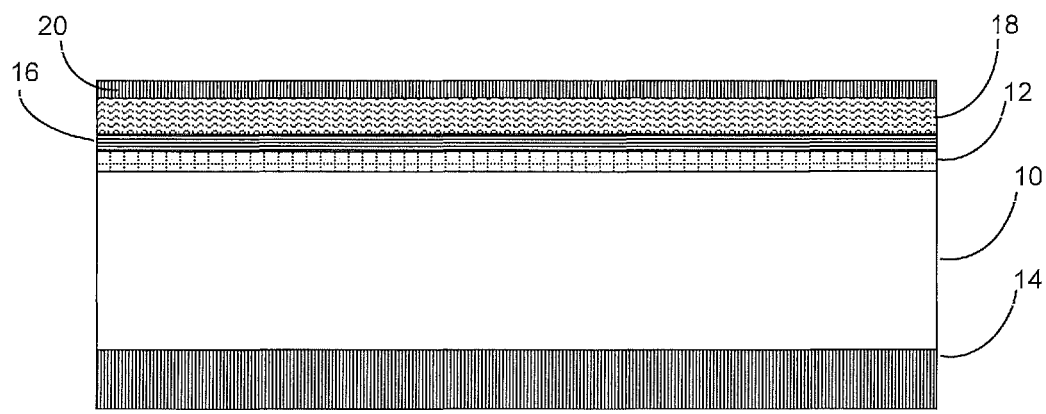

With further reference to FIG. 3(ii) an adhesion layer 20 such as Titanium, typically having a thickness in the range of 5 nm to 50 nm with typical tolerances in the range of ±5% may be deposited onto the surface of the piezoelectric layer—step (3(ii). Then, with reference to FIG. 3(iii) a first electrode of aluminum 22 may be deposited onto the adhesion layer 20—step 3(iii). The aluminum electrode is typically 100 nm thick with tolerances of ±5% being acceptable. Both adhesion layer 20 and aluminum electrode layer 22 may be deposited by sputtering for example.

Subsequently, depending on the type of resonator to be formed, such as an SMR resonator with Bragg reflectors or an FBAR type resonator, further layers may be deposited onto the aluminum electrode—step (iv), and then the support may be removed by removing the heat dissipating backing layer 14 with CMP, for example, followed by laser radiation of the GaN layer 12 through the sapphire single wafer 10, and then lift off. A second electrode, which may also be aluminum may then be deposited onto the freshly exposed second face of the piezoelectric membrane.

Using an aluminum anode is preferable since it is less heavy than conventional electrode materials used in RF resonators, and so it's mechanical damping effect on the resonator is much less. Aluminum also has low resistance and a superb low impedance. These factors minimize attenuation and help maintain a high Q factor for resonators and filters with aluminum electrodes.

Since a single crystal piezoelectric has no grain boundaries and since the electrode is fabricated from a low density metal, the attenuation of the acoustic signal in resonators combining both these features is minimal. To the best of our knowledge, single crystal $Ba_xSr_{(1-x)}TiO_3$ films have not been achieved in the past, so BST membranes with aluminum electrodes, particularly single crystal $Ba_xSr_{(1-x)}TiO_3$ films with aluminum electrodes are novel. Other low density candidate materials include carbon nanotubes and lithium, for example.

As shown, the aluminum electrode 22 is applied to a BST single crystal 18, however the advantage of using aluminum 22 as the electrode material of choice rather than heavy refractory metals with higher impedances is relevant for polycrystalline BST and for other piezoelectric materials, provided that subsequent processing and usage occurs at low temperatures, such that neither the piezoelectric material nor the aluminum anode are damaged.

In preferred embodiments of the invention, a single crystal piezoelectric, preferably a <111> orientation single crystal $Ba_xSr_{(1-x)}TiO_3$ film 18 is coated with a titanium adhesion layer and then with an aluminum electrode layer 22 by sputtering.

After subsequent processing, such as applying Bragg resonator layers and/or a silicon single crystal wafer backing layer, for example—step 3(iv) the $Ba_xSr_{(1-x)}TiO_3$ film 18 with aluminum electrode 22 may be detached from the GaN 12—step (v). First the heat dissipation layer 16 is removed by etching, polishing or by chemical mechanical polishing CMP, for example. Then, the GaN is irradiated through the sapphire substrate using a 248 nm excimer laser to disassociate the GaN enabling lift off. Such a pulsed laser, with a square waveform is available from IPG Photonics™. The process is known as laser lift off.

Residual GaN may be removed using Inductively Coupled Plasma (ICP) with $Cl_2$, $BCl_3$ and Ar for example. This can be achieved at temperatures of below 150° C., avoiding heat treatment of the piezoelectric thin film and subsequently deposited layers such as the electrode layer, Bragg reflectors, silicon for FBAR filters, etc.

Inductively Coupled Plasma (ICP) is a commercially available process, using equipment obtainable from NMC (North Microelectrics) China Tool and by SAMCO INC™, for example.

The U-GaN deposited coating may be more Gallium rich near to the interface with the piezoelectric making it difficult to remove. The purpose of the $TiO_2$ (rutile) and/or $SrTiO_3$ buffer layer 16, is to enable the removal of any residual GaN 12 without damaging the integrity of $Ba_xSr_{(1-x)}TiO_3$ single crystal film 18.

Once the substrate is removed, a second electrode may then be deposited onto the freshly exposed surface of the piezoelectric layer—step (vi). This second electrode may also comprise aluminum. With appropriate contacts and when mounted on a substrate, the piezoelectric layer may be used in resonators such as FBAR and SMR type resonator packages and filter arrangements.

Using BST, preferably single crystal BST, as the piezoelectric material in bulk acoustic wave resonators (BAW) such as surface mounted resonators (SMR) and FBARs provides several favorable properties for RF applications. Having low density, low dc resistance and low impedance, aluminum is an ideal electrode material so long as subsequent fabrication routes and usage do not expose it to high temperatures.

The high permittivity of the ferroelectric materials ($\varepsilon_r$>100) allows for reducing the size of devices. For example, in a standard 50-Ω RF system at low GHz frequencies, a typical BST resonator area is in the order of 0.001 mm2 and a typical BST filter area is about 0.01 mm2. Thus the resonator size is smaller by an order of magnitude when compared to conventional AlN resonators. As mobile communication equipment such as smart-phones become ever more complicated, they require ever more filters, and this small size is very important. Furthermore, the power consumption of BST resonators and filters is negligible even with a dc bias voltage across the device due to the very small leakage current of thin film ferroelectric BST.

Although single crystal BST with aluminum electrodes are discussed, it will be appreciated that single crystal piezoelectric membranes of other material such as AlN, ZnO and PZT will have lower impedances than polycrystalline membranes of the same material. Also polycrystalline BST promises smaller filters than those obtainable with polycrystalline AlN. Aluminum electrodes are favorable due to their low weight and thus minimal damping, so long as processing temperatures and operating temperatures are kept low.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A resonator comprising a piezoelectric membrane sandwiched between upper and lower electrodes, wherein the lower electrode comprises aluminum, wherein the piezoelectric membrane is a single crystal, and wherein the piezoelectric membrane further includes $Ba_xSr_{(1-x)}TiO_3$.

2. A resonator comprising a piezoelectric membrane sandwiched between upper and lower electrodes, wherein the lower electrode includes aluminum, and wherein the piezoelectric membrane includes $Ba_xSr_{(1-x)}TiO_3$ single crystal.

3. The resonator of claim 2 wherein the piezoelectric membrane has an <111> orientation.

4. The resonator of claim 1 wherein x is between 0.2 and 0.5 and is controlled to within a tolerance of ±1%.

5. The resonator of claim 1 further comprising an adhesion layer between the lower electrode and the piezoelectric membrane.

6. The resonator of claim 5 wherein the adhesion layer comprises titanium.

7. The resonator of claim 5 wherein the adhesion layer has a thickness in the range of 5 nm to 50 nm.

8. The resonator of claim 1 wherein the lower electrode is 100 nm±5 nm thick.

9. The resonator of claim 1 wherein both upper and lower electrodes comprise aluminum.

* * * * *